(12) United States Patent
Kawashima et al.

(10) Patent No.: US 7,490,650 B2
(45) Date of Patent: Feb. 17, 2009

(54) WORKPIECE PROCESSING DEVICE

(75) Inventors: Isamu Kawashima, Tokyo (JP); Hideshi Sato, Tokyo (JP); Hideo Kino, Tokyo (JP); Minoru Ametani, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 11/752,146

(22) Filed: May 22, 2007

(65) Prior Publication Data

US 2007/0277934 A1 Dec. 6, 2007

(30) Foreign Application Priority Data

Jun. 5, 2006 (JP) .............................. 2006-155921

(51) Int. Cl.
*H01L 21/67* (2006.01)
*H01L 21/673* (2006.01)
*H01L 21/677* (2006.01)
*H01L 21/68* (2006.01)

(52) U.S. Cl. ................... 156/350; 156/247; 156/249; 156/344; 156/384; 156/538; 156/584; 414/935; 438/976

(58) Field of Classification Search ............... 156/247, 156/249, 379, 277, 344, 584; 438/464, 33, 438/113, 114, 976; 198/463.1, 464.1, 465.1; 414/935, 936, 937, 939, 941

See application file for complete search history.

(56) References Cited

U.S. PATENT DOCUMENTS 4,696,712 A * 9/1987 Nonaka ...................... 156/351

(Continued)

FOREIGN PATENT DOCUMENTS

EP  1 310 432 B1  2/2006

(Continued)

OTHER PUBLICATIONS

Patent Abstracts of Japan, Publication No. 2000-068293, Published on Mar. 3, 2000, in the name of Tsujimoto, et al.

(Continued)

*Primary Examiner*—Jeff H. Aftergut
*Assistant Examiner*—Brian R Slawski
(74) *Attorney, Agent, or Firm*—Christie, Parker & Hale, LLP

(57) ABSTRACT

A workpiece processing device (10) for processing a workpiece (60; 20, 36) comprises: a surface protection film peeling means (50) for peeling a surface protection film (110), which is adhered to a front surface (21) of a workpiece, with a peeling tape (4); a bar code adhering means (11) for adhering a bar code (65) corresponding to the workpiece to the workpiece; and a movable support table (72) for supporting the workpiece. A peeling operation for peeling the surface protection film conducted by the surface protection film peeling means and a adhering operation for adhering a bar code conducted by the bar code adhering means are given to the workpiece while the workpiece is being supported by the support table. Due to the foregoing, it is possible to avoid failures when adhering the bar code to the workpiece, such as a wafer. The bar code adhering means may adhere the bar code, which corresponds to character information of the workpiece read out by an optical reading means, to the workpiece.

8 Claims, 5 Drawing Sheets

U.S. PATENT DOCUMENTS

| | | | |
|---|---|---|---|
| 5,118,369 | A | 6/1992 | Shamir |
| 6,249,943 | B1 | 6/2001 | Matsushita et al. |
| 6,946,311 | B2 * | 9/2005 | Kawashima ................. 438/33 |
| 2001/0010972 | A1 | 8/2001 | Robinson et al. |
| 2004/0074607 | A1 | 4/2004 | Hayasaka et al. |
| 2006/0068524 | A1 | 3/2006 | Yamamoto |
| 2006/0219359 | A1 | 10/2006 | Miyamoto et al. |
| 2007/0162175 | A1 * | 7/2007 | Segawa et al. .............. 700/121 |
| 2007/0187036 | A1 * | 8/2007 | Ametani ..................... 156/344 |

FOREIGN PATENT DOCUMENTS

| | | | |
|---|---|---|---|
| JP | 62-8966 | | 1/1987 |
| JP | 11-074231 | | 3/1999 |
| JP | 2000-68293 | | 3/2000 |
| JP | 2002-343756 | | 11/2002 |
| JP | 2005-317711 | | 11/2005 |
| JP | 2006-35159 | | 2/2006 |
| JP | 2007-214496 | | 8/2007 |
| KR | 20020026668 | * | 4/2002 |
| KR | 2002-0089180 | | 11/2002 |

OTHER PUBLICATIONS

Australian Patent Office Search Report, mailed Oct. 8, 2007, for Application No. SG 200703938-1, in the name of Tokyo Seimitsu Co., Ltd. (JP).

Patent Abstracts of Japan, Publication No. 62-008966; Date of Publication: Jan. 16, 1987; in the name of Minoru Ametani, et al.

Patent Abstracts of Japan, with English translation of patent application; Publication No. 2002-343756; Date of Publication: Nov. 29, 2002; in the name of Kazuo Kobayashi.

Patent Abstracts of Japan, with English translation of patent application; Publication No. 2005-317711; Date of Publication: Nov. 10, 2005; in the name of Masaki Tsujimoto et al.

Australian Search Report dated Mar. 21, 2007 corresponding to related application No. 200700265.2.

Office action corresponding to a related application, with English translation, dated Jan. 30, 2008, for KR patent application No. 10-2007-0013959, indicating the relevance of JP 62-8966 and KR 2002-89180.

English translation of Japan Patent Publication JP 2007-214496 listed above which corresponds to Japan Patent Application JP 2006-35159 previously filed as "On Order" in the May 22, 2007 IDS.

U.S. Office action for related U.S. Appl. No. 11/704,454, indicating relevance of U.S. Publication 2006/0068524 listed above.

English translation of Japan Publication JP 11-074231 listed above, no date.

* cited by examiner

WORKPIECE PROCESSING DEVICE

CROSS-REFERENCE TO RELATED APPLICATION

This application claims priority of Japanese Patent Application Number 2006-155921, filed on Jun. 5, 2006.

BACKGROUND OF THE INVENTION

1. Field of the Invention

The present invention relates to a workpiece processing device for processing a wafer workpiece, on the front surface of which a circuit pattern is formed and a surface protection tape is adhered, integrated with a mount frame into one body by a dicing tape.

2. Description of the Related Art

In the field of manufacturing semiconductors, there is a tendency for large-sized wafers to be used year after year. Further, in order to enhance packing density, wafer thickness is reduced. In order to reduce the wafer thickness, back-grinding is conducted on the back surface of a semiconductor wafer. At the time of back-grinding, in order to protect a semiconductor element formed on the front surface of a wafer, a surface protection film is adhered to the front surface of the wafer.

After back-grinding is complete, the wafer is conveyed to a workpiece processing device. FIG. 5 is a view showing a workpiece processing device of the prior art disclosed in Japanese Patent Application No. 2006-35159. A wafer 20, on the front surface 21 of which a surface protective film 110 is adhered, is subjected to back-surface grinding by a back-grinder 1 as shown in FIG. 5 and conveyed to a workpiece processing device 100.

A dicing tape is adhered to the back surface of a wafer 20 in a dicing tape adhering unit 300, so that the wafer 20 can be integrated with a mount frame 36 into one body. After surplus dicing tape has been wound by a surplus dicing tape winding unit 400, the wafer 20 and the mount frame 36 are conveyed to a surface protection film peeling unit 500. The surface protection film 110 is peeled off the front surface 21 of the wafer 20 by a well-known method.

The wafer 20 is then conveyed to a stage 270a in the workpiece processing device 100 and subjected to UV irradiation processing and/or expansion processing. Next, character information previously formed on the front surface of the wafer 20 is read out by an optical reading device (not shown). A bar code corresponding to the thus read character information is adhered to the dicing tape between the wafer 20 and the mount frame 36 or adhered to the mount frame 36 itself. This bar code contains information necessary for dicing the wafer. Next, the wafer 20 is accommodated in a cassette 16 and conveyed to a dicing device (not shown) together with the cassette 16.

In the dicing device, the bar code previously described is read out by a bar code reader (not shown). According to the information of the bar code, the operating condition of the dicing device is automatically set.

In the workpiece processing device disclosed in Japanese Patent Application No. 2006-35159, after the surface protection film 110 has been peeled by the surface protection film peeling unit 500, the wafer 20 is conveyed to a table different from the table (not shown) used for the surface protection film peeling unit 500. The wafer 20 is then subjected to the bar code adhering processing.

Since the back surface 22 of the wafer 20 is ground as previously described, the thickness is reduced. Accordingly, when the table for supporting the wafer 20 (and the mount frame 36) is changed after the surface protection film 110 has been peeled, the dicing tape and/or wafer 20 slightly undulates. When the dicing tape and/or wafer 20 slightly undulates, it is impossible for the optical reading device to accurately read out the character information of the wafer. Accordingly, an error occurs when the character information on the wafer is read. Further, in the case where the bar code is adhered to the dicing tape 3 between the wafer 20 and the mount frame 36, it becomes difficult to adhere the bar code.

In this case, in the dicing step, which is an after-step, it is impossible to appropriately set the operating condition of the dicing device according to the bar code. As a result, yield is lowered or working time is delayed.

The present invention has been accomplished in view of the above circumstances. An object of the present invention is to provide a workpiece processing device capable of avoiding failures when adhering a bar code.

SUMMARY OF THE INVENTION

In order to accomplish the above object, the first aspect provides a workpiece processing device for processing a workpiece comprising: a surface protection film peeling means for peeling a surface protection film, which is adhered to a front surface of the workpiece, with a peeling tape; a bar code adhering means for adhering a bar code corresponding to the workpiece to the workpiece; and a movable support table for supporting the workpiece, wherein a peeling operation for peeling the surface protection film conducted by the surface protection film peeling means and a adhering operation for adhering a bar code conducted by the bar code adhering means are given to the workpiece while the workpiece is being supported by the support table.

In the first aspect, after the surface protection film has been peeled from the wafer on the support table, without releasing the suction operation of the workpiece, the bar code adhering operation is conducted on the workpiece on the same support table. That is, it is not necessary to move the workpiece from the support table to another support table between the surface protection film peeling operation and the bar code adhering operation. Since the support table is not changed, it is possible to prevent the workpiece from undulating. As a result, the bar code can be appropriately adhered to the workpiece. Accordingly, it is possible to avoid failures when adhering the bar code. In this connection, the terminology of the workpiece includes both a single body of a wafer and a body in which the wafer and the mount frame are integrated with each other by the dicing tape.

According to the second aspect, as in the first aspect, a workpiece processing device further comprises: an optical reading means for reading out character information previously formed on the workpiece, which is arranged between the surface protection film peeling means and the bar code adhering means, wherein the bar code adhering means adheres a bar code, which corresponds to character information of the workpiece that has been read out by the optical reading means, onto the workpiece, and the workpiece is read by the optical reading means while the workpiece is being supported by the support table.

In the second aspect, it is possible to avoid failures in reading character information on the wafer.

According to the third aspect, as in the first or the second aspect, a workpiece processing device further comprises a cleaning means for cleaning the workpiece, arranged in the upstream of the surface protection film peeling means in a moving direction of the support table.

In the third aspect, after the workpiece has been cleaned by the cleaning means, the surface protection film is peeled. Due to the foregoing, the adhesive force between the peeling tape and the surface protection film is enhanced, so that failure of adhering the peeling tape can be prevented.

These and other objects, features and advantages of the present invention will be more apparent in light of the detailed description of exemplary embodiments thereof as illustrated by the drawings.

BRIEF DESCRIPTION OF THE DRAWINGS

In the drawings:

FIG. 2b is a perspective schematic illustration showing the cleaning nozzle shown in FIG. 2a;

DETAILED DESCRIPTION OF THE PREFERRED EMBODIMENTS

Figure 1:
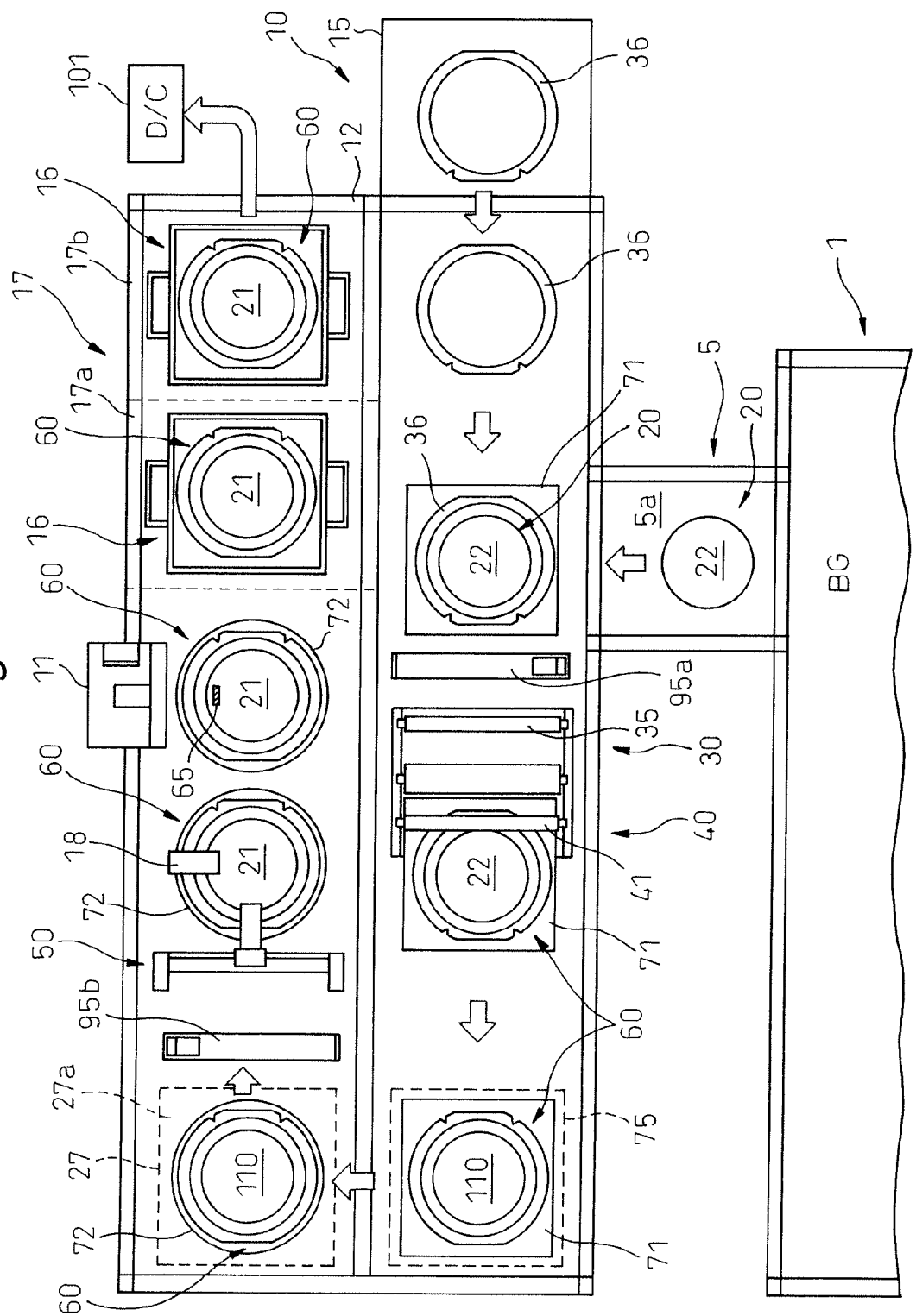
FIG. 1 is a top view showing a wafer processing device according to the present invention.

Referring to the accompanying drawings, an embodiment of the present invention will be explained below. Like reference numerals are used to indicate like parts in the following drawings. In order to facilitate understanding, the reduced scale used in these drawings has been appropriately changed.

FIG. 1 is a plan view showing a wafer processing device according to the present invention. In FIG. 1, a wafer processing device 10 is arranged adjacent to a back-grinder 1. As shown in FIG. 1, this wafer processing device 10 is connected to the back-grinder 1 by a first UV irradiation portion 5 (ultraviolet ray irradiation portion).

In a housing 12 of the wafer processing device 10 shown in FIG. 1, a mount frame arrangement portion 15, in which a plurality of mount frames 36 are arranged, is provided. In this housing 12, a cassette region 17 for a cassette 16, in which wafers 20 integrated with the mount frames 36 are accommodated, is arranged adjacent to the mount frame arrangement portion 15. Further, in FIG. 1, a bar code adhering unit 11 for adhering a bar code label is arranged on front of the cassette region 17 in the housing 12.

In the wafer processing device 10 shown in FIG. 1, a first support table 71 for supporting the wafer 20 and the mount frame 36 is arranged in the longitudinal direction of the housing 12.

As shown in the drawing, a first cleaning nozzle 95a, a dicing tape adhering unit 30 and a surplus dicing tape winding unit 40 are arranged in this order in a movement passage of the first support table 71 when a view is taken from the mount frame arrangement portion 15 side. The movement passage of the first support table 71 ends at an inversion region 75.

As shown in FIG. 1, a waiting region 27 is provided adjacent to the inversion region 75. In the initial stage, a second support table 72, which is arranged in the waiting region 27, can be moved in the longitudinal direction in the opposite direction to the first support table 71. As shown in the drawing, a second cleaning nozzle 95b, a surface protection film peeling unit 50, an optical reading device 18 and a bar code adhering unit 11 are arranged in this order in a movement passage of the second support table 72 when a view is taken from the waiting region 27 side.

As shown in the drawing, a cassette region 17 includes: a workpiece accommodation region 17a for accommodating the wafer 20 and others on the second support table 72 into the cassette 16; and a cassette taking-out region 17b for taking out the cassette 16, in which a plurality of wafers 20 and others are accommodated, from the wafer processing device 10. As can be seen from FIG. 1, the movement passage of the second support table 72 ends in front of the cassette 16 arranged in the work accommodation region 17a.

Although not shown in the drawing, the wafer processing device 10 of the present invention includes a control portion, such as a digital computer. Each element of the wafer processing device 10 is connected to and controlled by the control portion. The operation of the wafer processing device 10 of the present invention will be explained below.

First of all, under the condition that a surface protection film 110 for protecting a circuit pattern formed on a front surface of the wafer is adhered to the front surface 21, the wafer 20 is supplied to the back-grinder 1. In the back-grinder 1, under the condition that the surface protection film 110 on the front surface 21 of the wafer 20 is sucked, a back surface 22 of the wafer 20 is ground by a well known method. Due to the foregoing, the wafer 20 is ground and the thickness of the wafer 20 is reduced to, for example, 50 micrometers or less. Next, while the back surface 22 of the wafer 20, that is, a ground face 22 of the wafer 20 is being held, the wafer 20 is supplied to UV irradiation portion 5.

A stage 5a of the first UV irradiation portion 5 for connecting the back-grinder 1 with the wafer processing device 10 is made of transparent hard material. Under the stage 5a, UV irradiation device not shown is arranged. When the wafer passes through the first UV irradiation portion 5, the front surface 21 of the wafer 20, that is, the surface protection film 110 faces the stage 5a of the UV irradiation portion 5. At this time, the surface protection film 110 is irradiated with UV by the first UV irradiation portion 5 through the stage 5a. Due to the foregoing, the surface protection film 110 is hardened. Therefore, the adhesion of the surface protection film 110 to the front surface 21 of the wafer 20 is somewhat reduced. Accordingly, the surface protection film 110 can be easily peeled off as described later.

In the case where the surface protection film 110 has no ultraviolet ray hardening property, an irradiating operation is not conducted in the first UV ray irradiation portion 5, and the wafer 20 merely passes through UV irradiation portion 5.

After the wafer 20 has passed through the first UV irradiation portion 5, it is conveyed to the first support table 71 of the wafer processing device 10 by a robot hand (not shown in the drawing). Then, the wafer 20 is sucked to and held by the support table 71. That is, the surface protection film 110 of the wafer 20 is held by the first support table 71 and the back surface 22 of the wafer 20 is exposed. One mount frame 36 is conveyed from the mount frame arrangement portion 15 to the first support table 71 and sucked to and held by the support table 71 in the same manner.

First, the first support table 71 is moved to the first cleaning nozzle 95a so as to clean the wafer 20 and the mount frame 36. The cleaning nozzle 95a extends in a direction perpendicular to the moving direction of the first support table 71 in a range of at least the diameter of the wafer 20, preferably in a range exceeding the diameter of the mount frame 36.

Figure 2A:
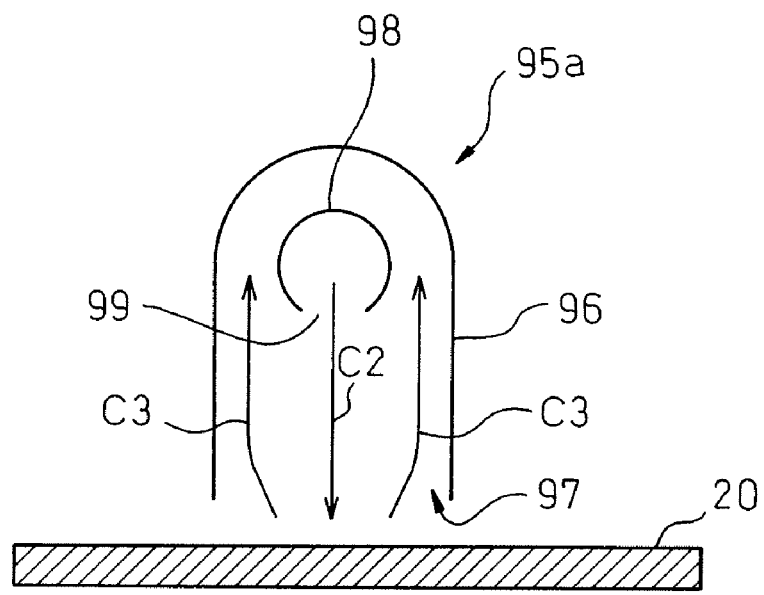
FIG. 2a is a sectional schematic illustration showing a cleaning nozzle.
Figure 2B:
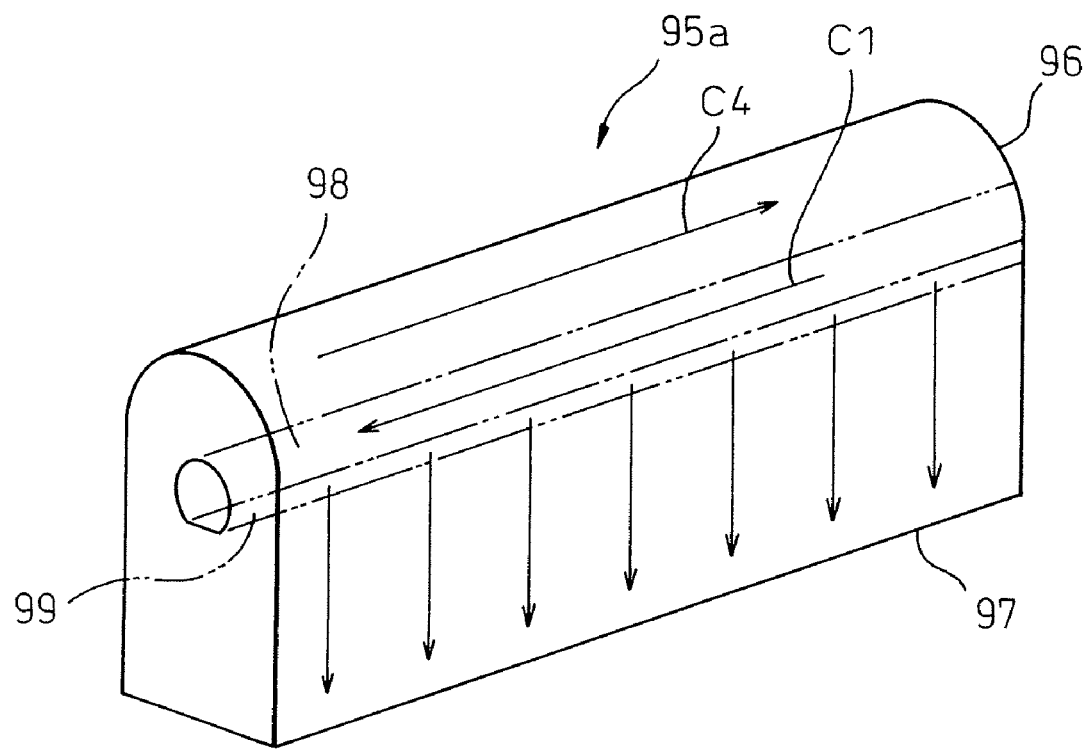

FIG. 2a is a sectional schematic illustration showing the cleaning nozzle. FIG. 2b is a perspective schematic illustration showing the cleaning nozzle shown in FIG. 2a. As shown in these drawings, in a lower portion of the housing 96 of the cleaning nozzle 95a, an opening 97 is formed in a direction perpendicular to the moving direction of the table. Further, in the housing 96, a pipe line 98 extends in the same direction. In a lower portion of the pipe line 98 facing to the opening 97, an opening 99 is formed in the same direction. As shown in the drawing, the opening 97 of the housing 96 and the opening 99 of the pipe line 98 are formed on the same side.

As shown in FIGS. 2a and 2b, when cleaning fluid, for example, dry air is made to flow in the pipe line 98 in the direction of arrow C1, this cleaning fluid is injected from the opening 99 along the pipe line 98. The cleaning fluid flows out from the housing 96 through the opening 97 as shown by arrow C2. After the cleaning fluid has flowed out from the housing 96, it collides with the wafer 20 and the mount frame 36 located under the cleaning nozzle 95a. The wafer 20 and others are then cleaned. Then the cleaning fluid rises along an inner wall of the housing 96 as shown by arrow C3 and flows in the housing 96 in the direction of arrow C4 and is then recovered.

Before the dicing tape 3 is adhered, the wafer 20 and the mount frame 36 on the first support table 71 can be cleaned by the first cleaning nozzle 95a. Especially, the back surface 22 of the wafer 20 can be cleaned by the first cleaning nozzle 95a. Since the back surface 22 of the wafer 20 is a ground surface, which was ground by the back-grinder 1, there is a possibility that grinding chips may be attached to the back surface, 22 of the wafer 20. However, when the back surface 22 is cleaned by the cleaning nozzle 95a before the dicing tape 3 is adhered, the grinding chips are dispersed. Accordingly, the dicing tape 3 can be adhered to the back surface 22. Due to the foregoing, the adhesive force of the dicing tape 3 can be enhanced.

After the cleaning has been completed by the first cleaning nozzle 95a, the wafer 20 and the mount frame 36 are supplied to the dicing tape adhering unit 30 by the first support table 71. The dicing tape adhering unit 30 includes a adhering roller 35. By the adhering roller 35, the dicing tape 3 is adhered to the wafer 20 and the mount frame 36 by a well-known method.

Then a cutting portion (not shown) is driven. By this cutting portion, the dicing tape 3 is cut into a circle along the front surface of the mount frame 36. As a result, a hole, the shape of which corresponds to the outline of the mount frame 36, is formed on the dicing tape 3. In this connection, in the case where a dicing tape 3, which has previously been subjected to punching, is used, the cutting portion is not used.

Next, a winding roller 41 of a surplus dicing tape winding unit 40 is driven to mind a surplus dicing tape 3 by a well-known method. Due to the foregoing, the wafer 20 and the mount frame 36 are integrated with each other into one body. Therefore, the wafer 20 and the mount frame 36 can be easily handled in the next step. In the present invention, the wafer 20 and the mount frame 36, which have been integrated with each other by the dicing tape 3, will be referred to as "a workpiece" or "a workpiece 60", hereinafter.

The workpiece 60 is conveyed from the surplus dicing tape winding unit 40 to the inversion region 75 by the first support table 71. In the inversion region 75, the workpiece 60 is inverted upside down by a well-known method. As a result, the back surface 22 of the wafer 20 is directed downward and the surface protection film 110 on the front surface 21 of the wafer 20, on which the circuit pattern is formed, is directed upward.

Then the workpiece 60 is conveyed from the first support table 71 to a waiting region 27 by a robot hand (not shown). The waiting region 27 is composed in the same manner as that of the first UV irradiation portion 5. Therefore, the waiting region 27 may be used as the second UV irradiation portion as follows.

That is, a stage 27a of the second UV irradiation portion 27 is made of a transparent hard material. Under the stage 27a, UV irradiation device (not shown) is arranged. In the second UV irradiation device 27, the back surface 22 of the wafer 20, that is, the dicing tape 3 faces to the stage 27a. Accordingly, in the second UV irradiation portion 27, ultraviolet rays are irradiated to the dicing tape 3 through the stage 27a. Since the dicing tape 3 has an ultraviolet ray hardening property, it is hardened when ultraviolet rays are irradiated to the dicing tape 3. Therefore, in the next step of dicing, it is possible to prevent the adhesive agent of the dicing tape 3 from adhering to a dicing blade (not shown).

After that, the workpiece 60 is supported on the second support table 72. In this connection, the workpiece 60 may be directly supported on the second support table 27 without conducting the aforementioned UV processing.

The second support table 72 is then moved to the second cleaning nozzle 95b so as to clean the workpiece 60. Since the second cleaning nozzle 95b is composed in the same manner as that of the first cleaning nozzle 95a, explanations are omitted here. Due to the foregoing, in the surface protection film peeling unit 50, the peeling tape 4 can be adhered onto the clean surface protection film 110. Therefore, it is possible to enhance the adhesive force of the peeling tape 4.

Figure 3:
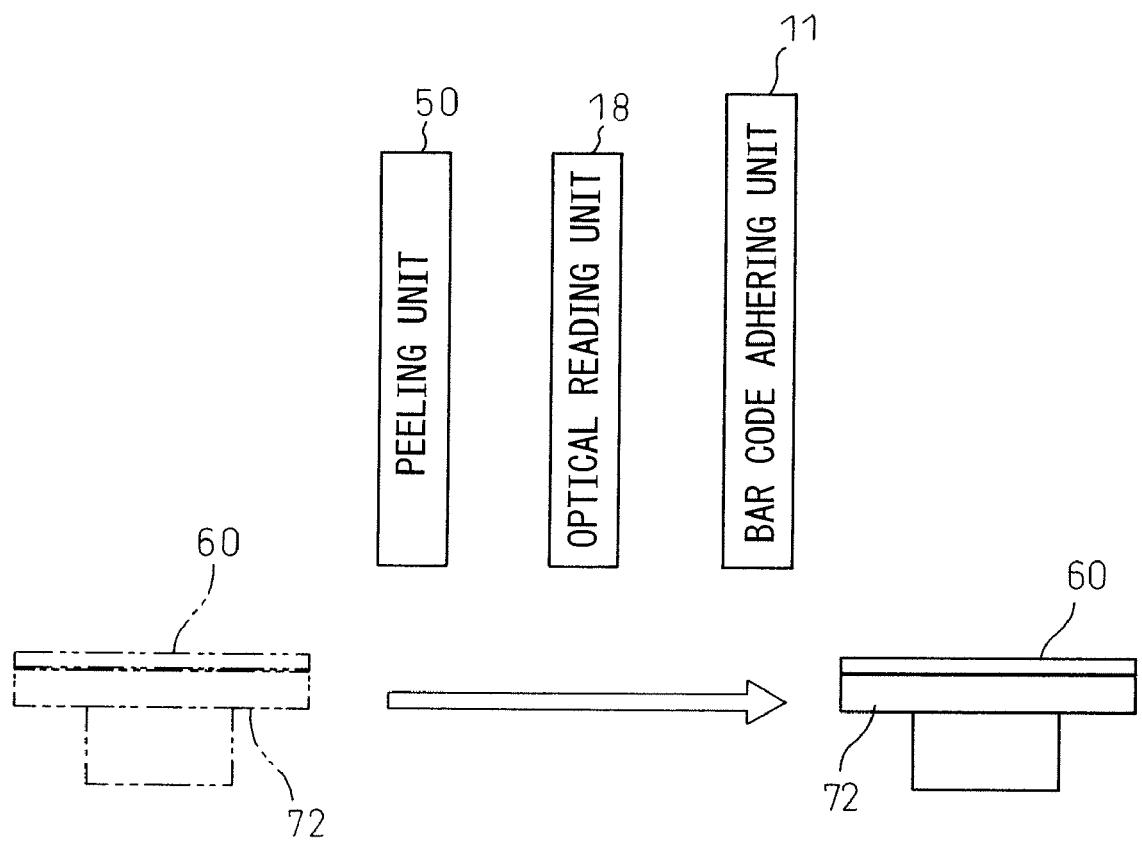
FIG. 3 is a schematic illustration showing a portion of the wafer processing device shown in FIG. 1.

FIG. 3 is a schematic illustration showing a portion of the wafer processing device shown in FIG. 1. As can be seen from FIGS. 1 and 3, the cleaned workpiece 60 is conveyed to the surface protection film peeling unit 50 by the second support table 72.

In the surface protection film peeling unit 50, the surface protection film 110 is peeled off from the wafer 20 by a well-known method. Specifically, the operation is conducted as follows. First, the peeling tape 4 is adhered to the surface protection film 110 on the wafer 20. Next, the peeling tape 4 is wound up. The adhesive force between the peeling tape 4 and the surface protection film 110 is stronger than the adhesive force between the surface protection film 110 and the wafer 20, so that at the time of winding the peeling tape 4, the surface protection film 110 is peeled off from the wafer 20, so that the front surface 21 of the wafer 20 is exposed.

The second support table 72 is then moved from the surface protection film peeling unit 50 to an optical reading device 18. This optical reading device 18 reads out character information, for example, ID number previously formed on the front surface 21 of the wafer.

After that, the second support table 72 is further moved from the optical reading device 18 to a bar code adhering unit 11. The bar code adhering unit 11 makes a new bar code 65 according to the character information which has read out by the optical reading device 18. The bar code contains information of types corresponding to the character information that was read out, for example, the bar code contains information necessary for dicing such as a type number of the wafer, a diameter, a thickness and alignment information.

Figure 4A:
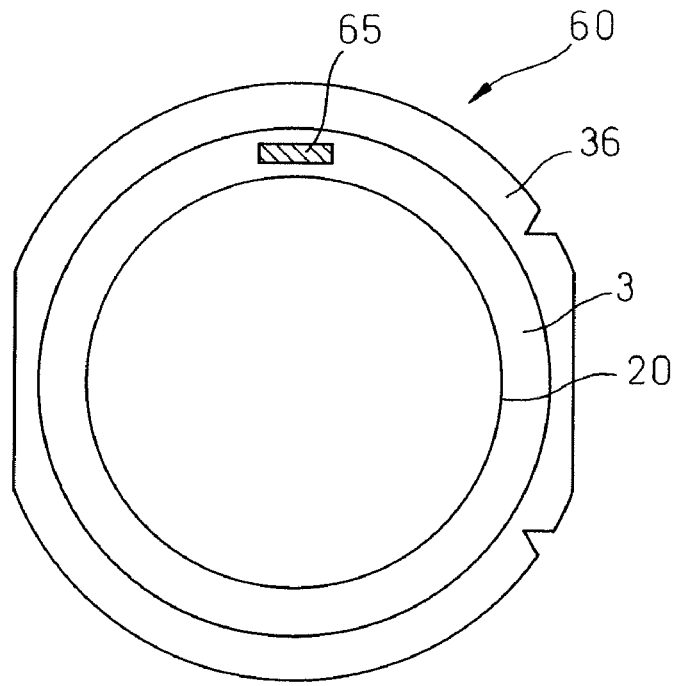
FIG. 4a is a view showing a adhering position of a bar code on a workpiece.
Figure 4B:
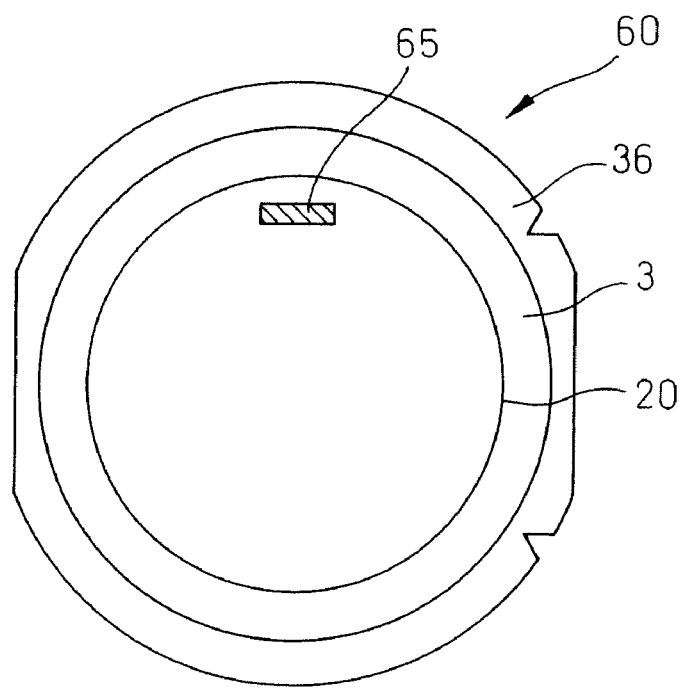
FIG. 4b is another view showing a adhering position of a bar code on a workpiece.
Figure 5:
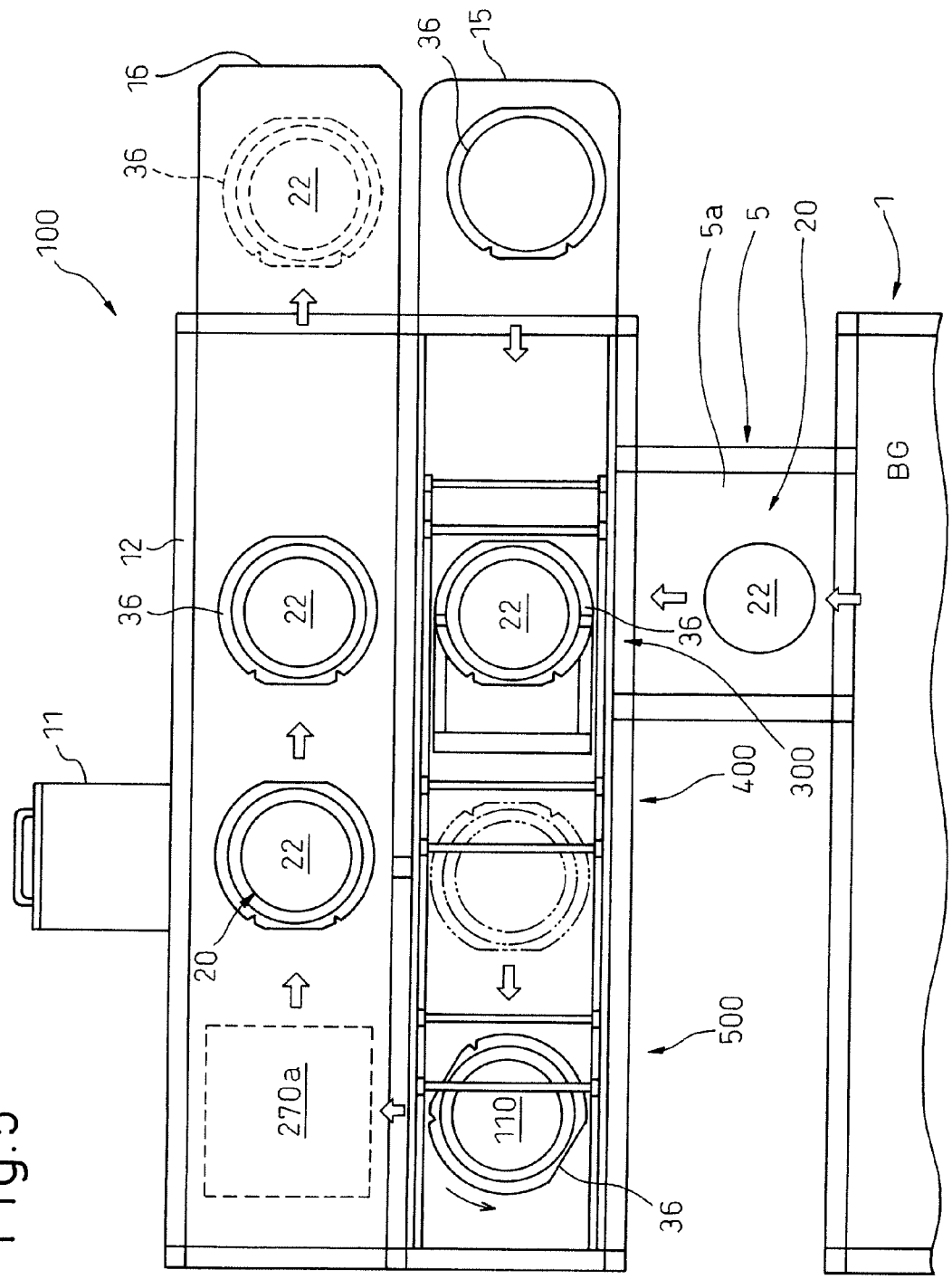
FIG. 5 is a top view showing a wafer processing device of the prior art.

The bar code adhering unit 11 advances on the workpiece 60 and adheres the bar code 65 at a predetermined position on the workpiece 60. As shown in FIGS. 4a and 4b, the bar code 65 may be adhered onto the dicing tape 3 between the mount frame 36 and the wafer 20. Alternatively, the bar code 65 may be directly adhered to the wafer 20. In this connection, although not shown in the drawing, the bar code 65 may be adhered to the mount frame 36.

As can be seen from FIG. 3, in the present invention, by moving the second support table 72, a peeling operation for peeling the surface protection film 110 in the surface protection film peeling unit 50, a reading operation for reading character information in the optical reading device 18 and a adhering operation for adhering the bar code 65 in the bar code adhering unit 11 are executed in this order. That is, in the wafer processing device 10 of the present invention, it is possible to conduct the peeling operation, the reading operation and the adhering operation without detaching the workpiece 60 from the second support table 72.

That is, since the workpiece 60 is not moved to another support table in the present invention, the workpiece 60 does not undulate. As a result, in the optical reading device 18, it is possible to accurately read out character information on the wafer 20. Therefore, it is possible to avoid failures in reading. In the same manner, in the bar code adhering unit 11, the bar code 65 can be accurately adhered to the workpiece 60. Therefore, it is possible to avoid failures when adhering the bar code. Especially in the case where the bar code 65 is adhered to the dicing tape 3 as shown in FIG. 4a, the occurrence of a failure in adhering the bar code can be effectively prevented by the present invention.

Referring to FIG. 1 again, the workpieces 60, onto which the bar codes 65 are adhered, are successively accommodated in the cassette 16 in the workpiece accommodation region 17a. After a predetermined number of workpieces 60 have been accommodated in the cassette 16, the cassette 16 is conveyed to the cassette taking-out region 17b. After that, the cassette 16 is taken out from the wafer processing device 10 and conveyed to the dicing device 101.

In the dicing device 101, the bar code reader (not shown) reads out the bar code 65 on the workpiece 60. Next, according to the information of a type recorded in the bar code, the operation condition of the dicing device 101 is automatically set. Since the bar code 65 is accurately adhered in the present invention, there is no possibility that the bar code reader of the dicing device 101 will fail to read the barcode. After that, according to the operation condition that has been set, the wafer 20 of the workpiece 60 is diced.

In the embodiment explained above referring to the drawings, ID information is read out from the workpiece 60 by the optical reading device 18. However, the optical reading device 18 may be excluded when ID information of the workpiece 60 is directly input into the bar code adhering unit 11. It is clear that even the above case is included in the scope of the present invention.

Although the invention has been shown and described with exemplary embodiments thereof, it should be understood by those skilled in the art that the foregoing and various other changes, omissions and additions may be made therein, and thereto without departing from the scope of the invention.

The invention claimed is:

1. A workpiece processing device for processing a workpiece comprising:
   a surface protection film peeling means for peeling, with a peeling tape, a surface protection film adhered onto a front surface of the workface;
   a bar code adhering means for adhering to the workpiece a bar code corresponding to the workpiece; and
   a movable support table for supporting the workpiece, wherein
   the surface protection film peeling means is configured to peel the surface protection film and the bar code adhering means is configured to adhere a bar code to the workpiece while the workpiece is being supported by the movable support table.

2. The workpiece processing device according to claim 1, further comprising
   an optical reading means for reading character information on the workpiece, the optical reading means being between the surface protection film peeling means and the bar code adhering means, wherein
   the bar code adhering means is configured to adhere to the workpiece a bar code corresponding to character information of the workpiece to be read by the optical reading means, and
   the workpiece is read by the optical reading means while the workpiece is being supported by the support table.

3. A workpiece processing device according to claim 1 or 2, further comprising a cleaning means for cleaning the workpiece, the cleaning means being upstream of the surface protection film peeling means in a moving direction of the movable support table.

4. The workpiece processing device according to claim 1, wherein the surface protection film peeling means is located to encounter the workpiece being supported by the movable support table before the bar code adhering means encounters the workpiece.

5. A workpiece processing device for processing a workpiece comprising:
   a surface protection film peeler for peeling off a surface protection film adhered to a front surface of the workpiece;
   a bar code adherer for adhering to the workpiece a bar code corresponding to the workpiece; and
   a movable support table for supporting the workpiece, wherein the surface protection film peeler and the bar code adherer are adapted to operate on the workpiece while the workpiece is supported by the movable support table.

6. The workpiece processing device according to claim 5, wherein the surface protection film peeler includes peeling tape for peeling off the surface protection film.

7. The workpiece processing device according to claim 5, further comprising an optical reader for reading information on the bar code on the workpiece, the optical reader being between the surface protection film peeler and the bar code adherer, wherein the optical reader is adapted to read the bar code while the workpiece is being supported by the support table.

8. The workpiece processing device according to claim 5, wherein the surface protection film peeler is located to encounter the workpiece being supported by the movable support table before the bar code adherer encounters the workpiece.

* * * * *